(12) United States Patent
Lee et al.

(10) Patent No.: US 11,264,448 B2
(45) Date of Patent: Mar. 1, 2022

(54) DIELECTRIC THIN FILM AND MEMCAPACITOR INCLUDING THE SAME

(71) Applicant: UNIST (Ulsan National Institute of Science and Technology), Ulsan (KR)

(72) Inventors: Jun Hee Lee, Ulsan (KR); Noejung Park, Ulsan (KR)

(73) Assignee: UNIST (Ulsan National Institute of Science and Technology), Ulsan (KR)

( * ) Notice: Subject to any disclaimer, the term of this patent is extended or adjusted under 35 U.S.C. 154(b) by 85 days.

(21) Appl. No.: 16/697,542

(22) Filed: Nov. 27, 2019

(65) Prior Publication Data

US 2021/0143250 A1   May 13, 2021

(30) Foreign Application Priority Data

Nov. 12, 2019   (KR) .................. 10-2019-0144294

(51) Int. Cl.
  *H01L 27/11507*  (2017.01)
  *H01L 49/02*  (2006.01)
(52) U.S. Cl.
  CPC ........ *H01L 28/60* (2013.01); *H01L 27/11507* (2013.01)
(58) Field of Classification Search
  CPC ............... H01L 28/60; H01L 27/11507; H01L 28/40–92; H01L 27/0647–0652; H01L 27/067–0682; H01L 27/0711–0733; H01L 27/075–0755; H01L 27/0783–0794; H01G 4/00–40; H01G 9/00–28
  See application file for complete search history.

(56) References Cited

U.S. PATENT DOCUMENTS

| | | | |
|---|---|---|---|
| 6,518,609 B1 | 2/2003 | Ramesh | |
| 7,274,058 B2 | 9/2007 | Lee et al. | |
| 8,405,171 B2 | 3/2013 | Zheng et al. | |
| 8,969,169 B1 | 3/2015 | Chen et al. | |
| 9,082,551 B2 | 7/2015 | Osada et al. | |
| 9,909,233 B1* | 3/2018 | Ihlefeld | C30B 29/24 |
| 10,804,294 B2 | 10/2020 | Yoo | |
| 2011/0051310 A1* | 3/2011 | Strachan | H01G 7/06 361/281 |
| 2013/0149794 A1 | 6/2013 | Wang | |

(Continued)

FOREIGN PATENT DOCUMENTS

| | | |
|---|---|---|
| JP | 2012-240884 A | 12/2012 |
| KR | 10-0596391 B1 | 7/2006 |

(Continued)

OTHER PUBLICATIONS

U.S. Appl. No. 16/691,904, filed Nov. 22, 2019.

(Continued)

*Primary Examiner* — Shahed Ahmed
(74) *Attorney, Agent, or Firm* — Finch & Maloney PLLC

(57) ABSTRACT

Provided is a dielectric thin film. The dielectric thin film includes: a plurality of ferroelectric domains including phonons having displacement in a direction of a first axis; and a plurality of spacers configured to block elastic interaction between the phonons, wherein the ferroelectric domains and the spacers are alternately and repeatedly arranged along a second axis which is perpendicular to the first axis.

20 Claims, 14 Drawing Sheets

(56) References Cited

U.S. PATENT DOCUMENTS

| | | | |
|---|---|---|---|
| 2014/0113828 A1* | 4/2014 | Gilbert | H01L 39/225 505/100 |
| 2014/0291599 A1 | 10/2014 | Hwang | |
| 2015/0221658 A1 | 8/2015 | Wang | |
| 2015/0378243 A1* | 12/2015 | Kippelen | G02F 1/0126 359/244 |
| 2016/0111564 A1* | 4/2016 | Gidwani | H01M 4/8605 429/434 |
| 2019/0131426 A1 | 5/2019 | Lu et al. | |

FOREIGN PATENT DOCUMENTS

| | | |
|---|---|---|
| KR | 10-2014-0118176 A | 10/2014 |
| KR | 10-1742384 | 6/2017 |
| KR | 10-2019-010906 A | 9/2019 |

OTHER PUBLICATIONS

Notice of Allowance received in U.S. Appl. No. 16/691,904 dated Jul. 23, 2021, 8 pages.

Lee et al., "Strong polarization enhancement in asymmetric three-component ferroelectric superlattices", Nature 433, 395-399 (2005).

* cited by examiner

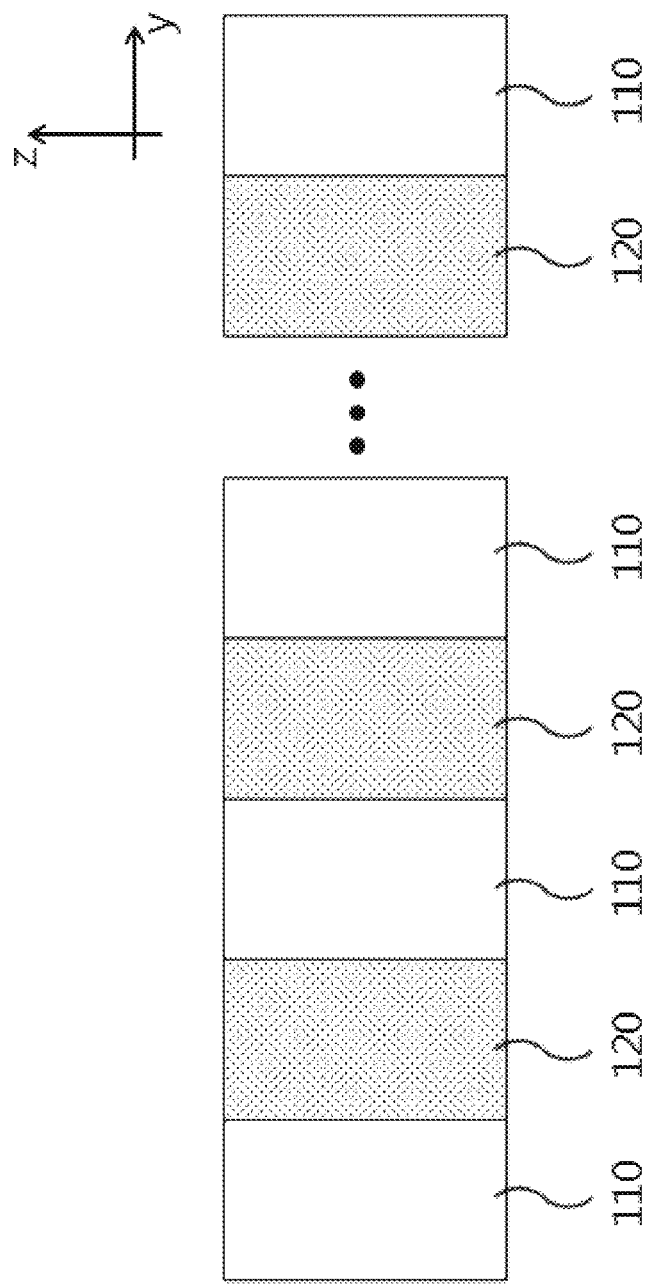
[Fig. 1]

[Fig. 2]
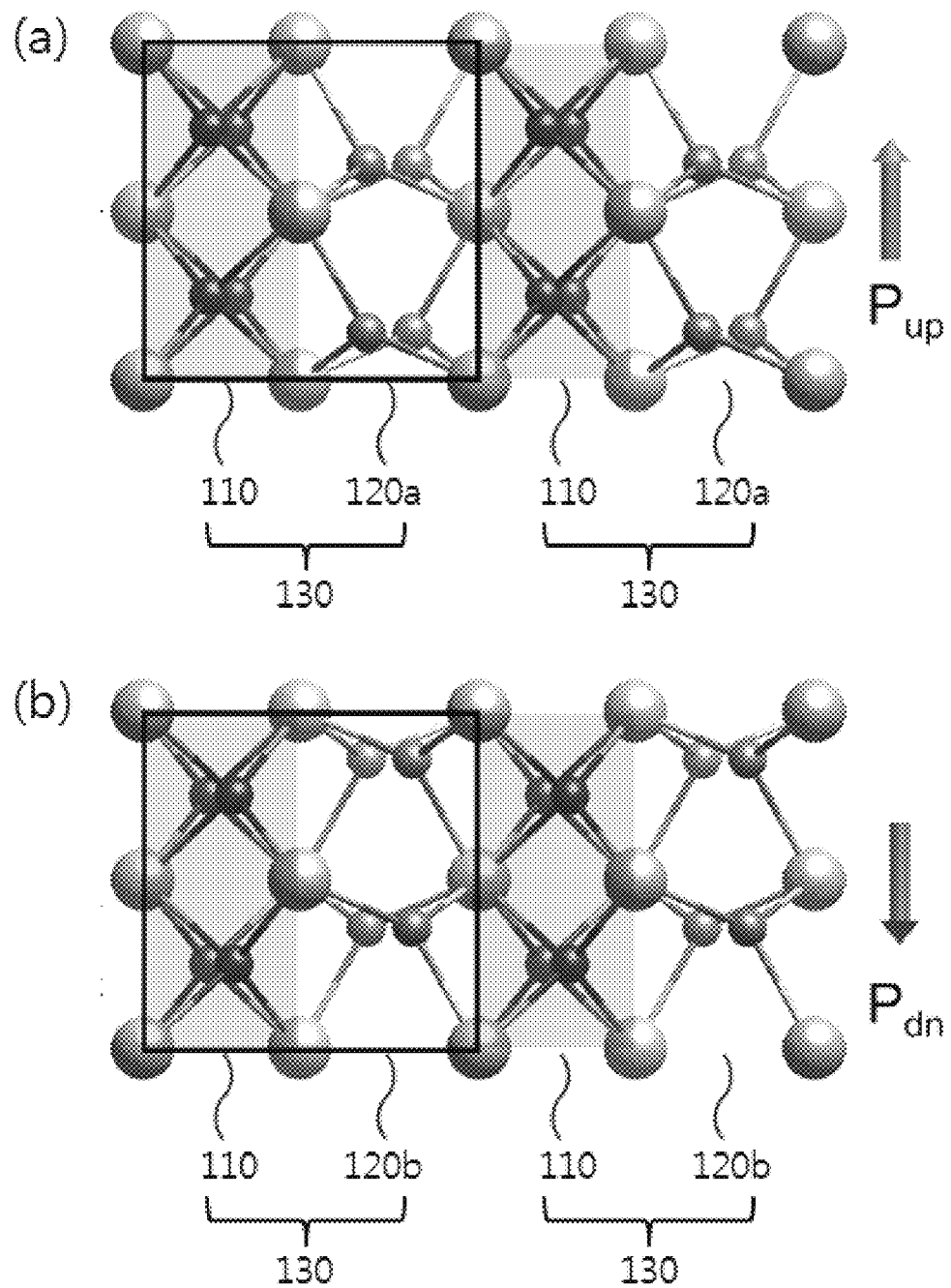

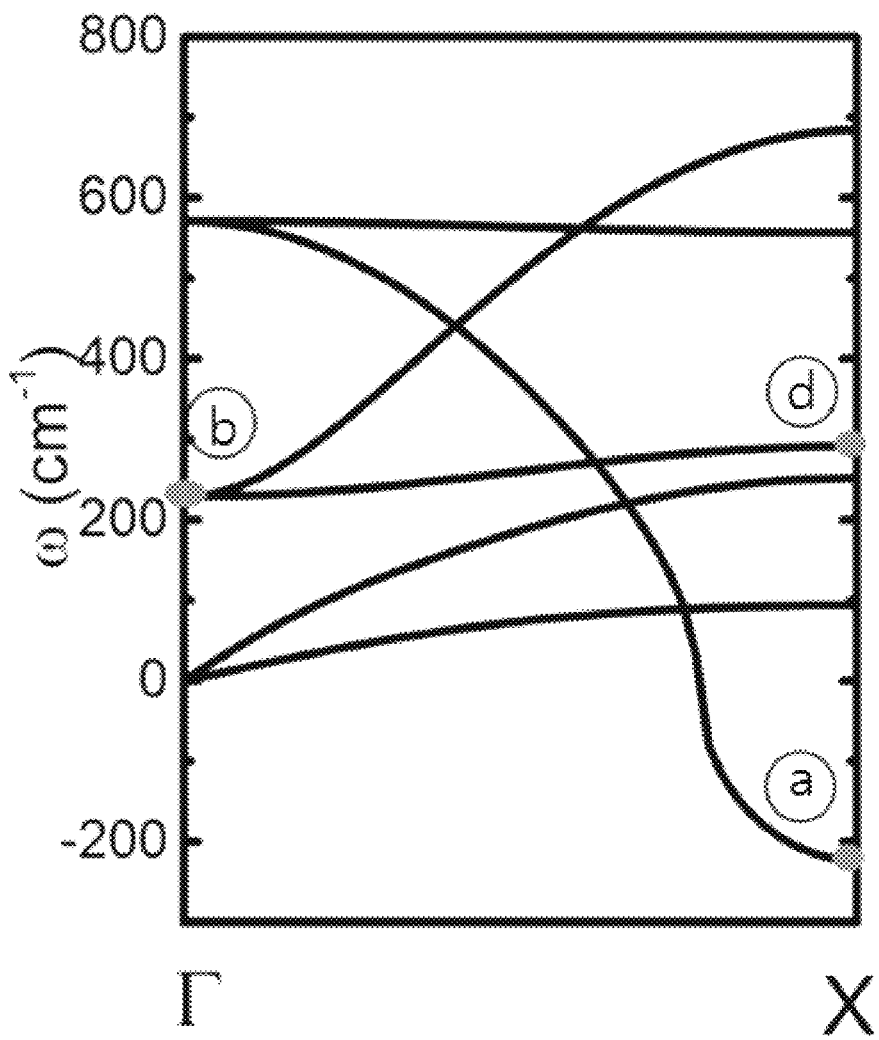
[Fig. 3]

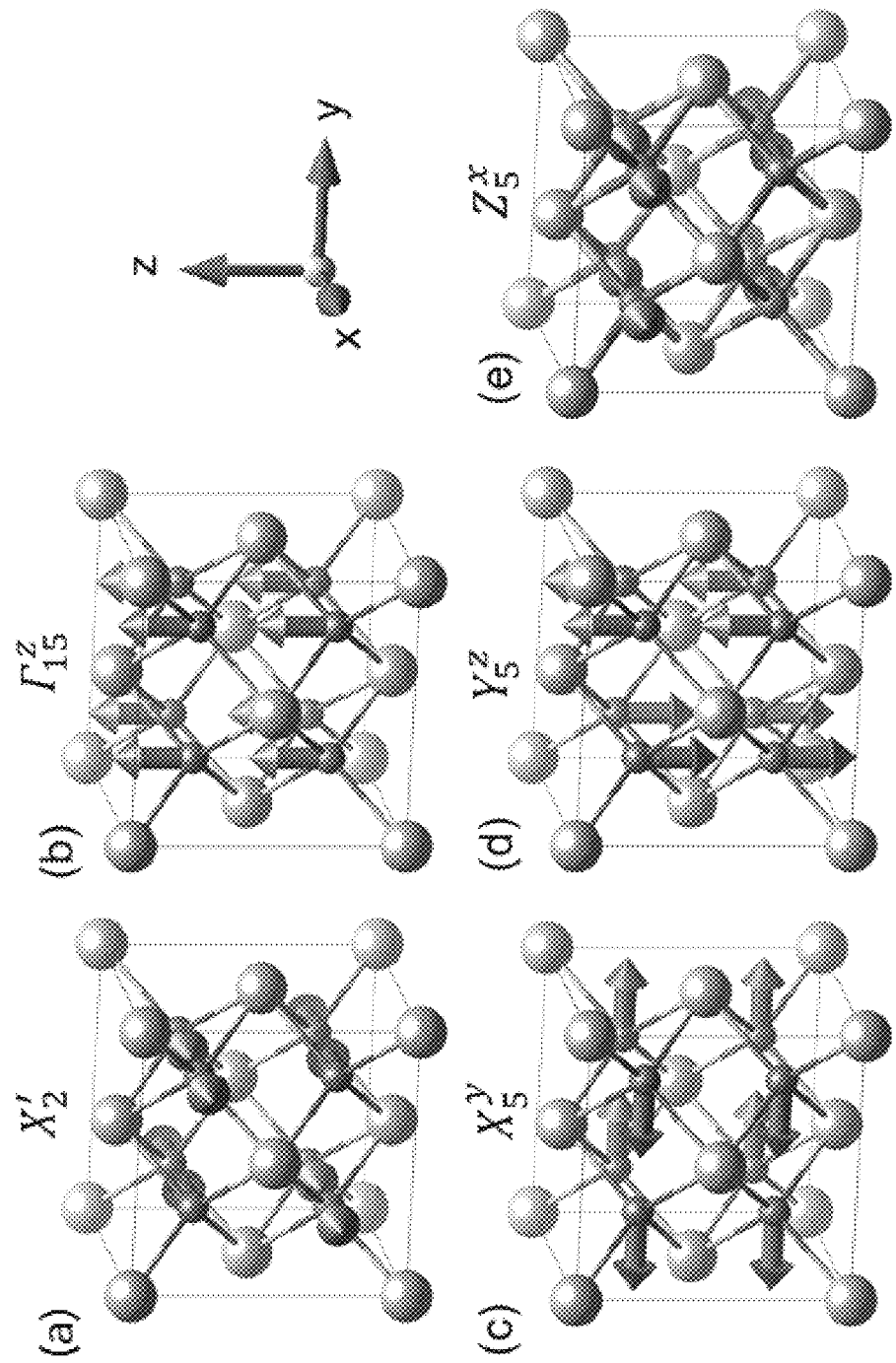
[Fig. 4]

[Fig. 5]
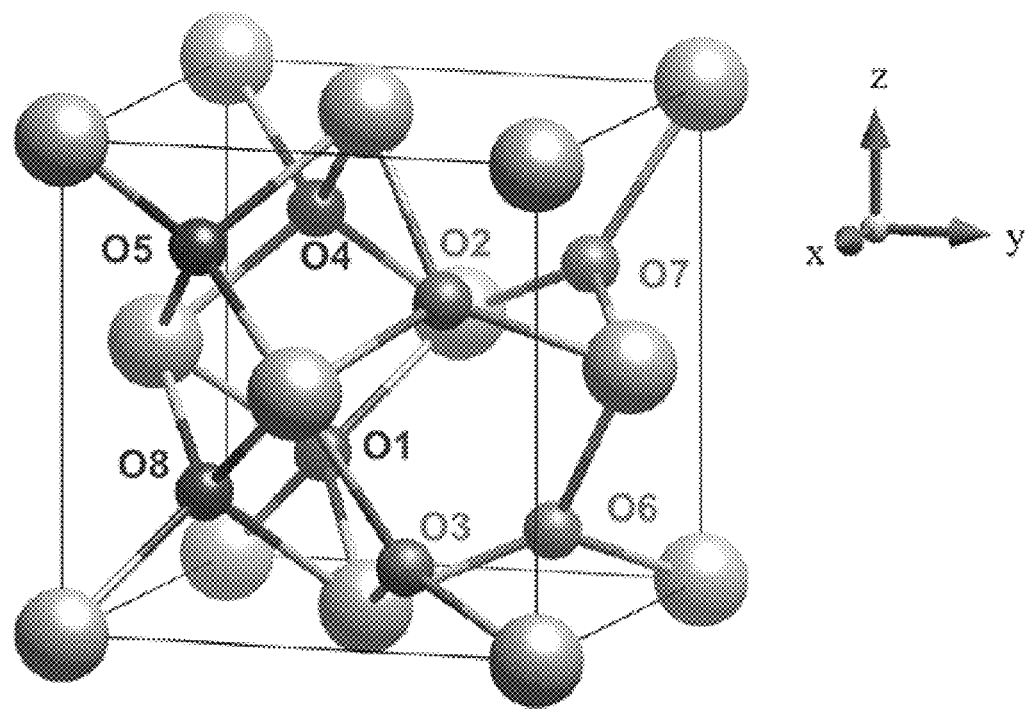

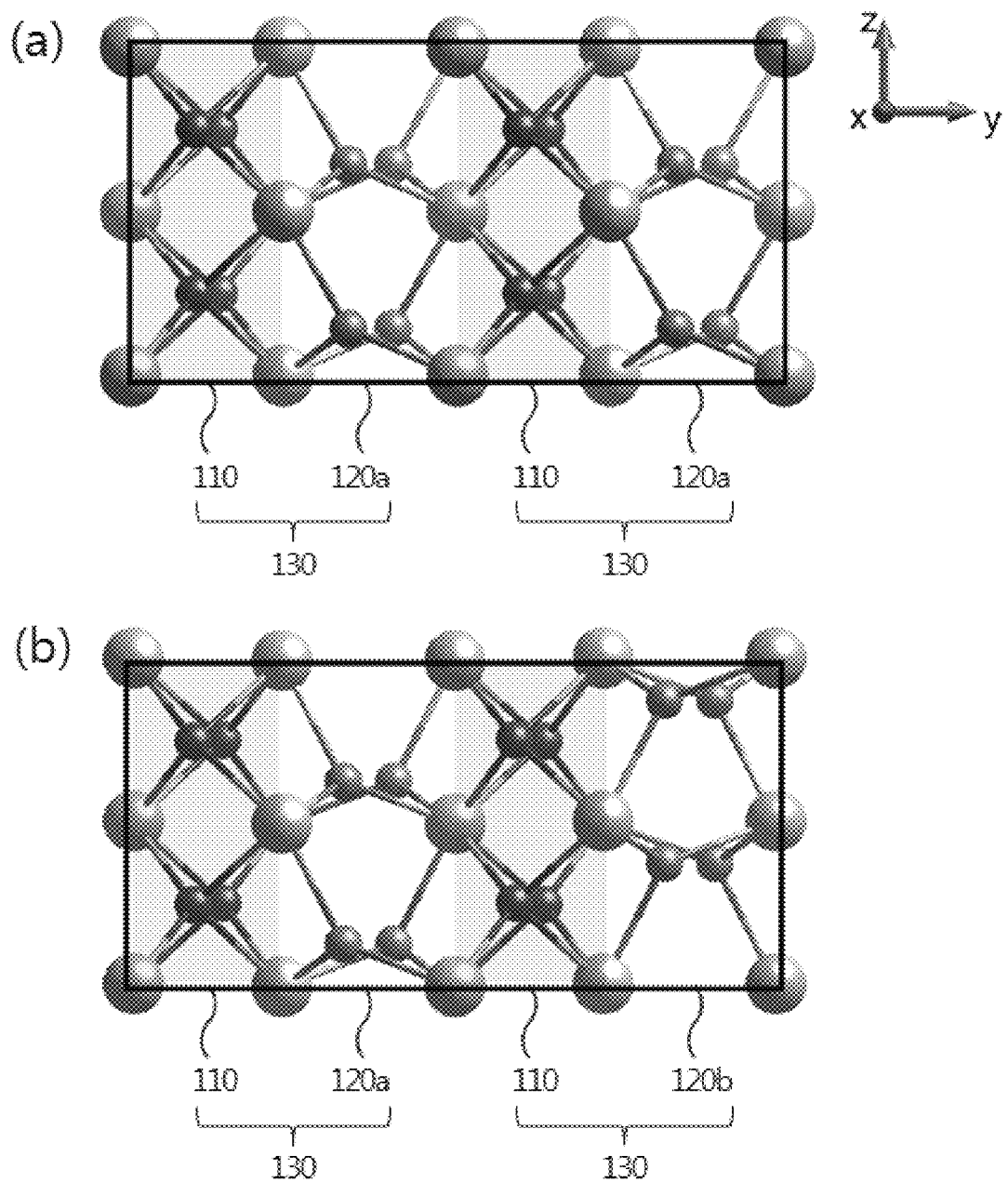
[Fig. 6]

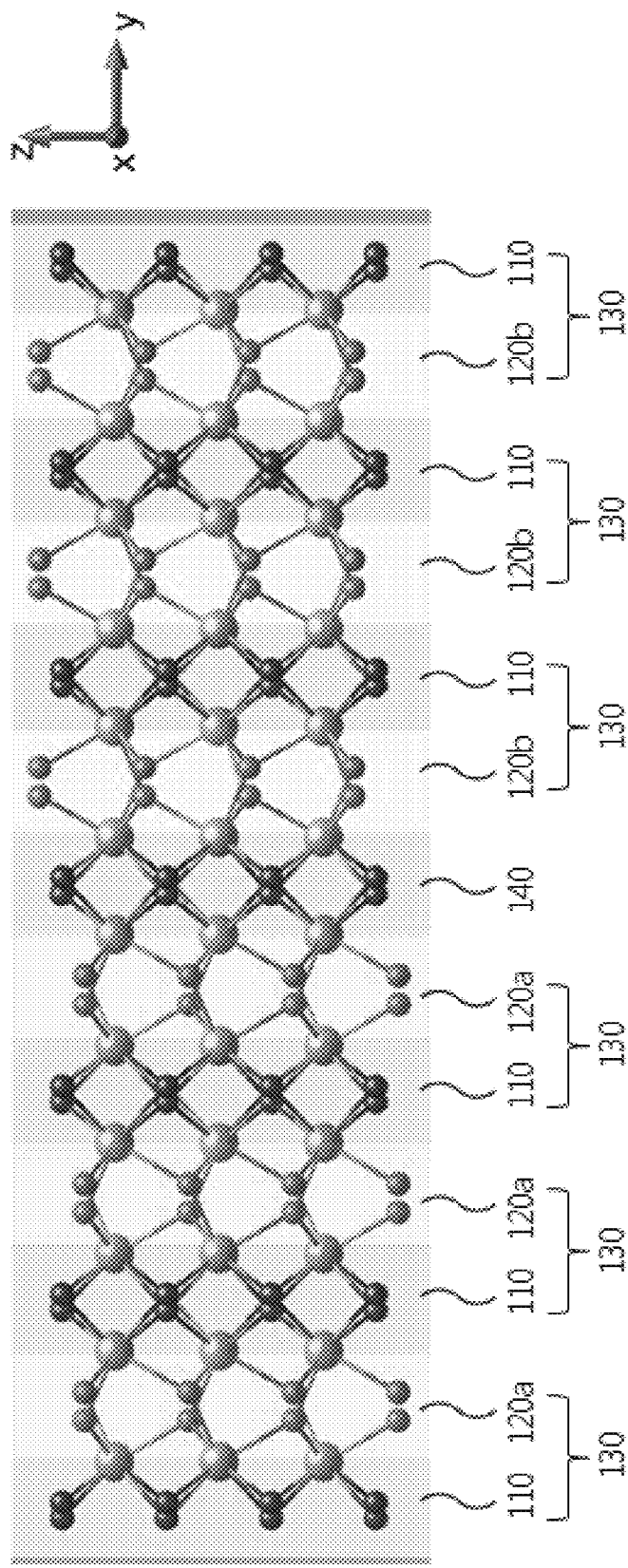

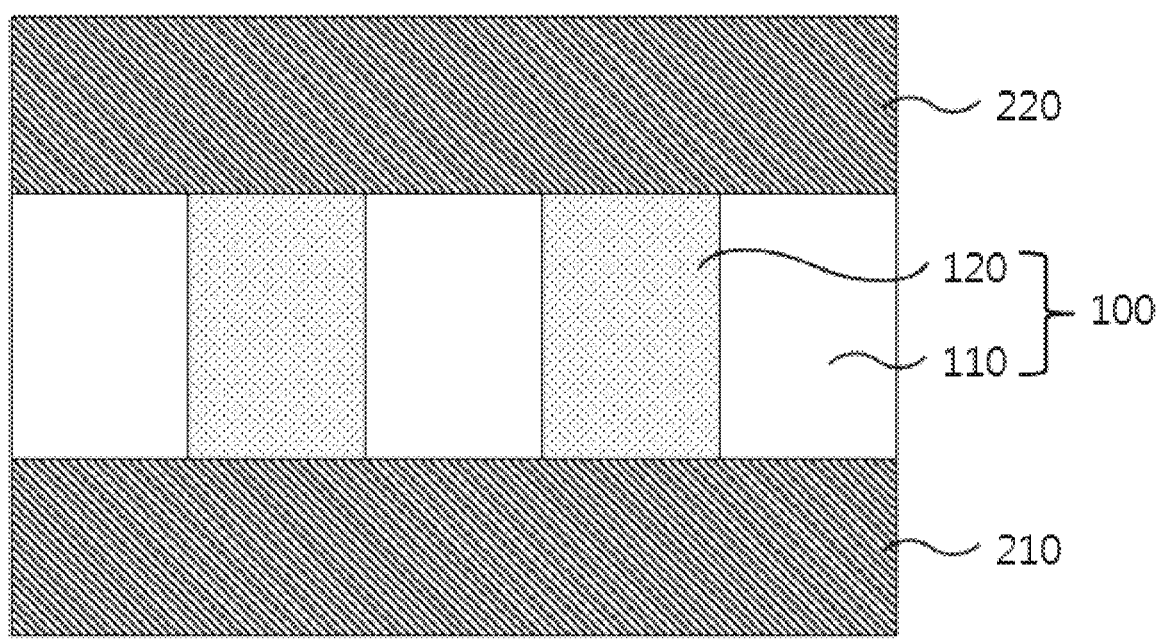
[Fig. 8]

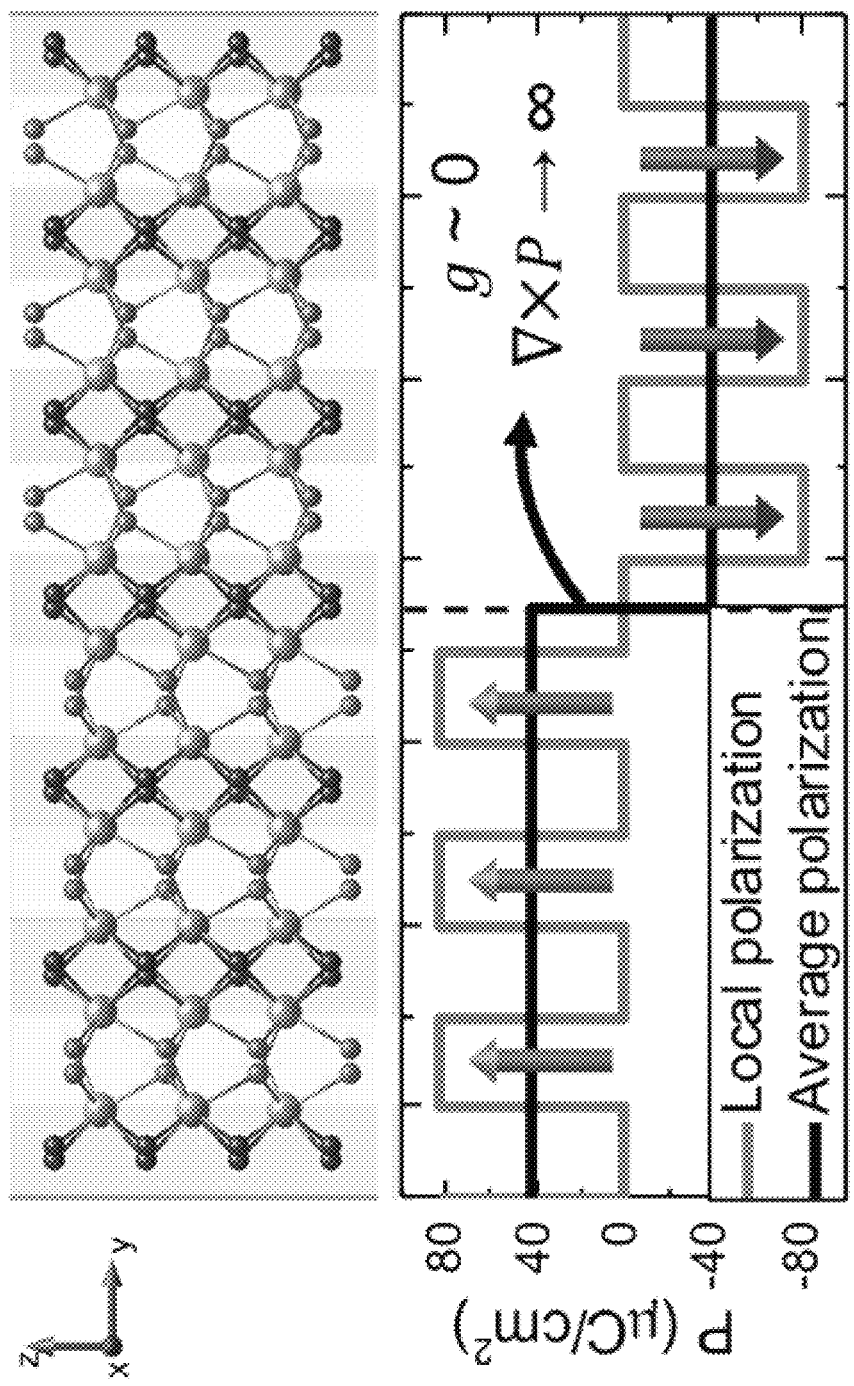
[Fig. 9]

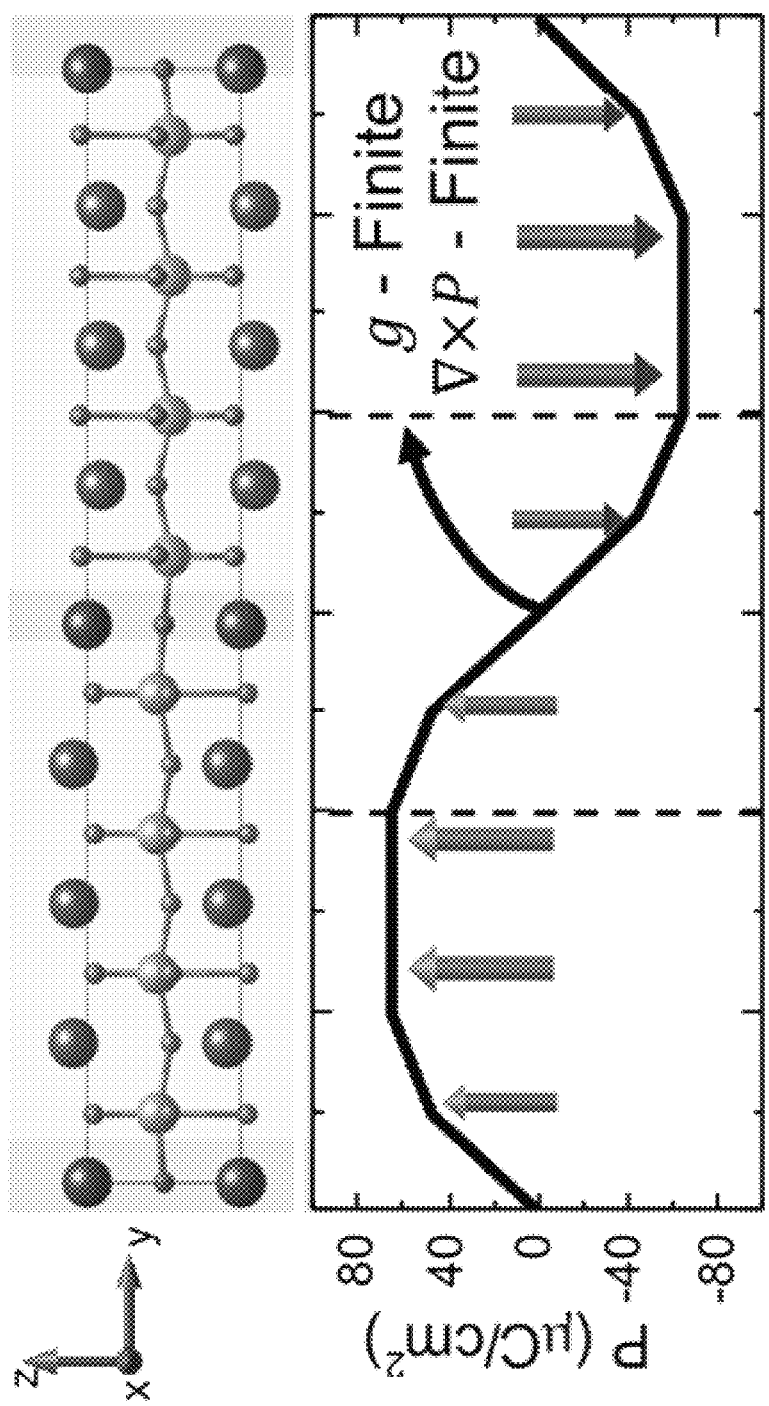
[Fig. 10]

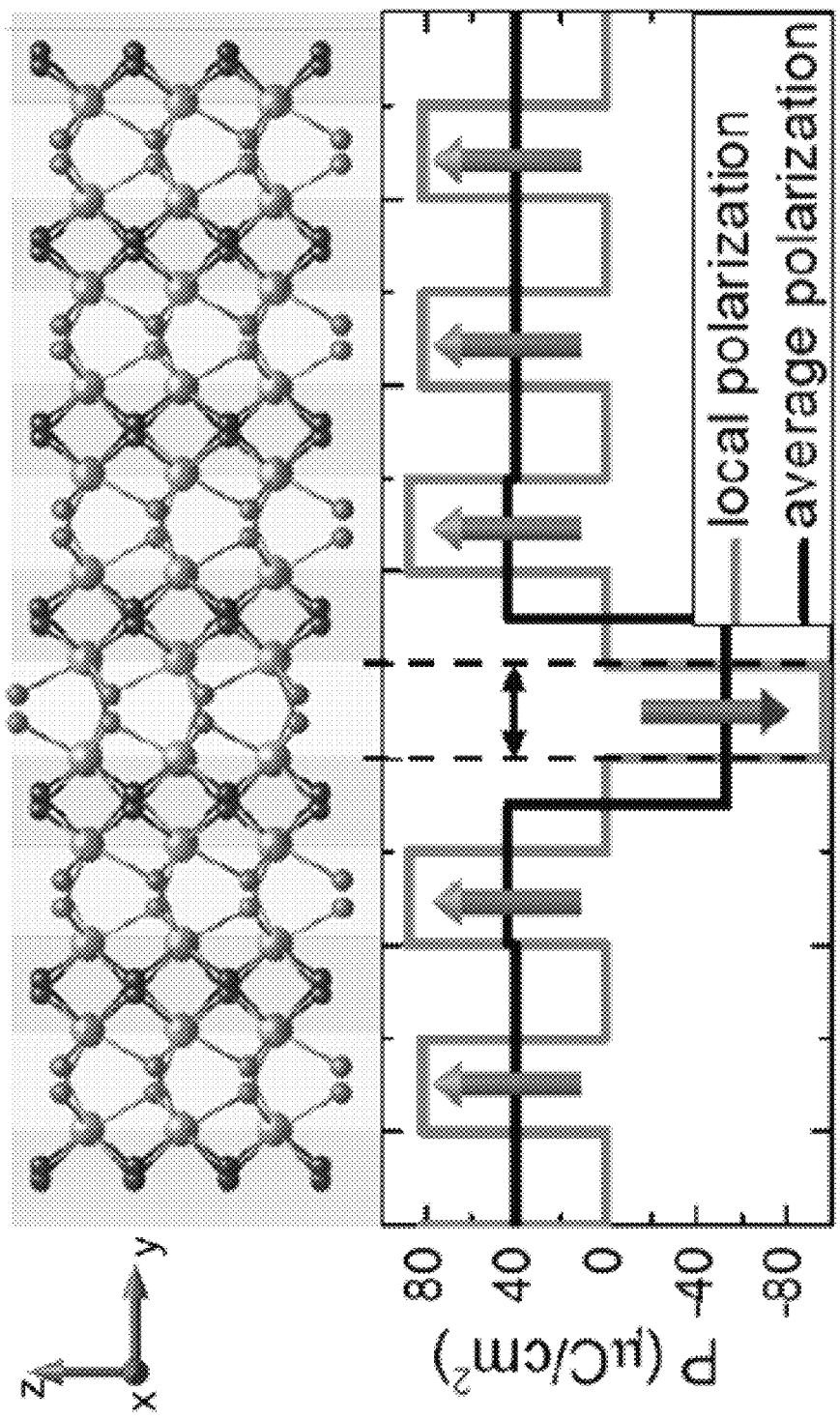
[Fig. 11]

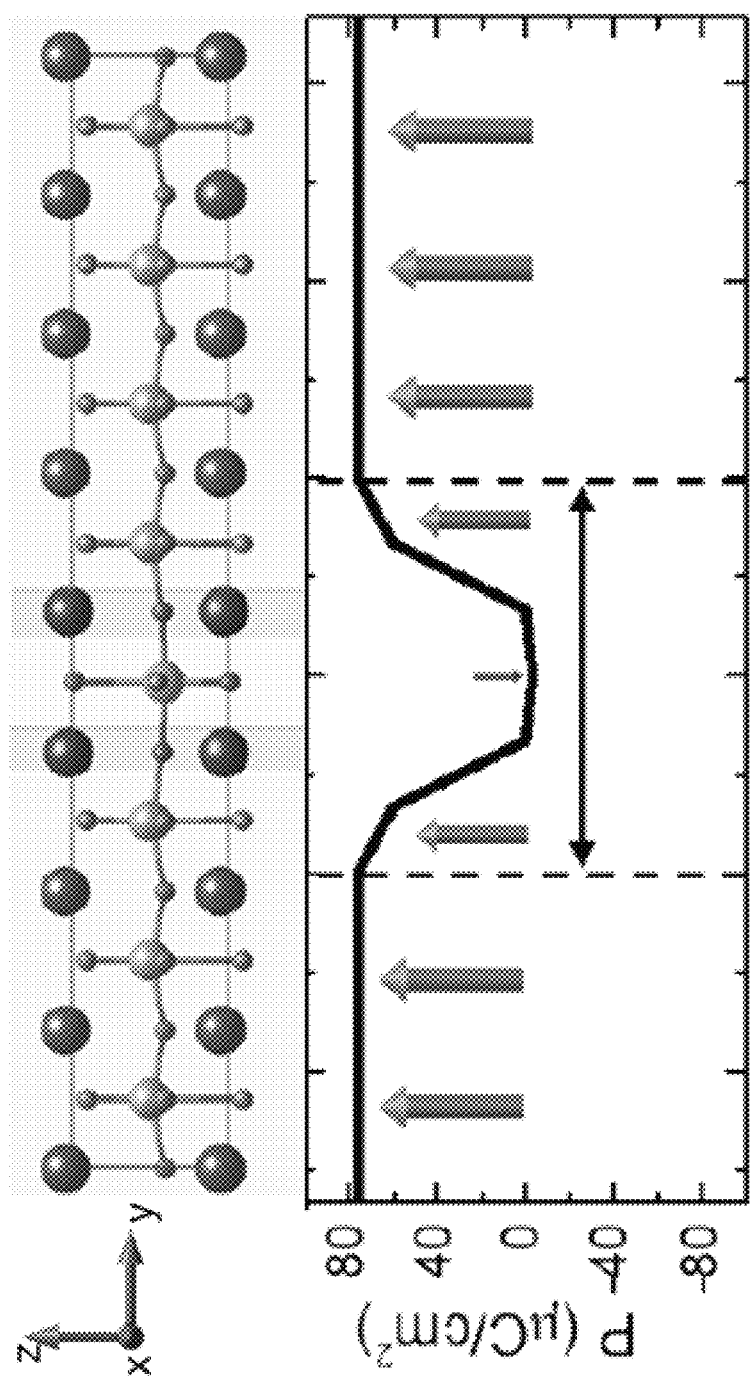
[Fig. 12]

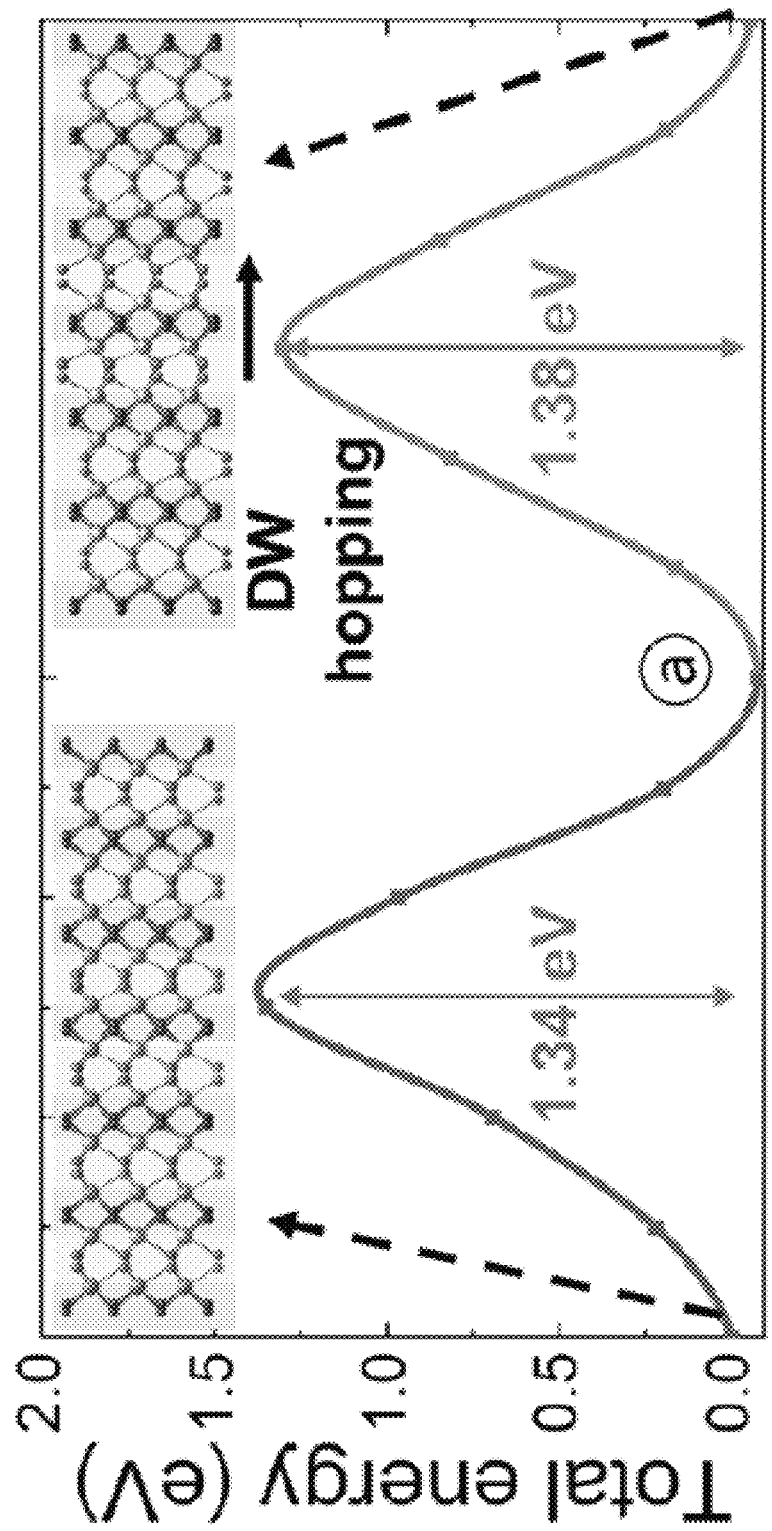
[Fig. 13]

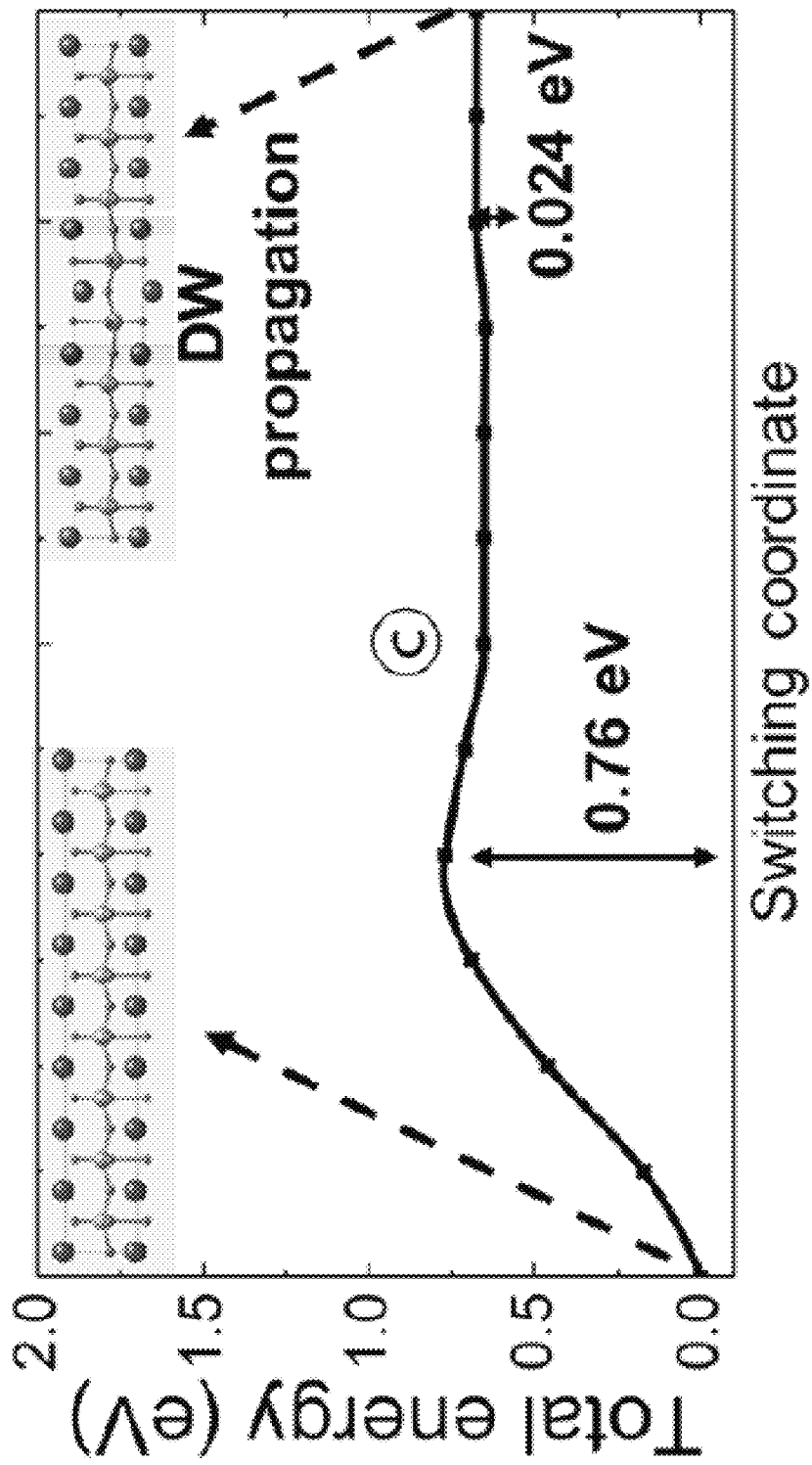
[Fig. 14]

DIELECTRIC THIN FILM AND MEMCAPACITOR INCLUDING THE SAME

CROSS-REFERENCE TO RELATED APPLICATIONS

This application claims the benefit of Republic of Korea Patent Application 10-2019-0144294 (filed 12 Nov. 2019), the entire disclosure of which is hereby incorporated by reference herein.

BACKGROUND OF THE INVENTION

1. Field of the Invention

The present disclosure relates to a dielectric thin film and a memcapacitor including the same, and more particularly, to a dielectric thin film and a memcapacitor including the same, in which the dielectric thin film includes: ferroelectric domains including phonons having displacement; and spacers configured to block elastic interaction between the phonons, wherein the ferroelectric domains and the spacers are alternately and repeatedly arranged.

2. Description of the Prior Art

In general, perovskite, which is a mainly used ferroelectric material, includes a metal element having an electric dipole, and spontaneous magnetization may occur due to interaction between electric dipoles by an electric field applied from an outside. The spontaneous magnetization may be stably maintained even after the external electric field is removed, and binary coating may be performed by magnetizing in an anti-parallel direction. Accordingly, the perovskite is used as a ferroelectric RAM (FeRAM).

However, ferroelectrics may be depolarized by surface charges. Accordingly, when sizes of the ferroelectrics are reduced, the surface charges may be increased so that ferroelectric properties may be decreased. Therefore, in match with the miniaturization of memory devices, researches on materials or device structures for stably maintaining ferroelectric properties even with a reduced size have been conducted.

For example, Korean Patent Registration Publication No. 10-13011251 (Application No. 10-2011-0118134) discloses a magnetic stack including a tunnel junction, a ferromagnetic free layer, a pinned layer, and at least one insulating layer, wherein the at least one insulating layer is formed of an electrically and thermally insulating material that blocks phonons while allowing electrical transmission through one conductive feature.

SUMMARY OF THE INVENTION

One technical object of the present disclosure is to provide a dielectric thin film and a memcapacitor including the same, in which the dielectric thin film includes: a plurality of ferroelectric domains including phonons having displacement and having polarization values that vary according to an electric field applied from an outside; and a plurality of spacers configured to block movements of the phonons and having predetermined polarization values with respect to the electric field applied from the outside, wherein the ferroelectric domains and the spacers are alternately and repeatedly stacked.

Another technical object of the present disclosure is to provide a dielectric thin film having multiple dielectric properties by controlling polarization for each unit cell, and a memcapacitor including the dielectric thin film.

The technical objects of the present disclosure are not limited to the above-described objects.

In order to achieve the technical objects, the present disclosure provides a dielectric thin film.

In accordance with an aspect of the present disclosure, the dielectric thin film includes: a plurality of ferroelectric domains including phonons having displacement in a direction of a first axis; and a plurality of spacers configured to block elastic interaction between the phonons, wherein the ferroelectric domains and the spacers are alternately and repeatedly arranged along a second axis which is perpendicular to the first axis.

According to one embodiment, the spacers may include a domain wall having fixed polarization with respect to an electric field applied from an outside, and the displacement of the phonons of the ferroelectric domain may be changed by hopping of the domain wall.

According to one embodiment, the dielectric thin film may include a hafnium oxide (HfO2) having an orthorhombic crystal structure, and the phonon of the ferroelectric domain may be included in an oxygen element of the hafnium oxide.

According to one embodiment, the dielectric thin film may have an orthorhombic crystal structure corresponding to a Pbca space group.

According to one embodiment, the dielectric thin film may include a metal oxide having an orthorhombic crystal structure corresponding to a Pbca space group, the ferroelectric domain may have a width corresponding to half of a unit cell of the metal oxide in the second axis, and the spacer may have a width equal to the width of the ferroelectric domain.

According to one embodiment, the dielectric thin film may include a hafnium oxide ($HfO_2$) having an orthorhombic crystal structure, and the ferroelectric domain may have a width of 3 Å or less in the second axis.

In order to achieve the technical objects, the present disclosure provides a memcapacitor.

In accordance with an aspect of the present disclosure, the memcapacitor includes: the dielectric thin film; an upper electrode disposed on the dielectric thin film in the first axis; and a lower electrode disposed under the dielectric thin film in the first axis, wherein the dielectric thin film includes a multiple dielectric constant thin film in which the phonons in each of the ferroelectric domains have displacement in one direction or a direction anti-parallel to the one direction along the first axis.

In order to achieve the technical objects, the present disclosure provides a dielectric thin film.

In accordance with an aspect of the present disclosure, in the dielectric thin film, spacers, which have fixed polarization with respect to an electric field applied from an outside, and ferroelectric domains, which have polarization controlled by the electric field applied from the outside, are alternately and repeatedly provided, and one spacer and one ferroelectric domain constitute a unit cell.

According to one embodiment, the dielectric thin film may include: a first area having a first polarization value and including a plurality of unit cells; and a second area having a second polarization value and including a plurality of unit cells, the spacers of the unit cells included in the first area may have the polarization lower than the polarization of the ferroelectric domain so that the polarization value of the first area may have a first pulse value, and the spacers of the unit cells included in the second area may have the polarization higher than the polarization of the ferroelectric domain so that the polarization value of the second area may have a second pulse value.

According to one embodiment, an average polarization value of the first area may be lower than polarization values of the ferroelectric domains included in the first area, and an average polarization value of the second area may be higher than polarization values of the ferroelectric domains included in the second area.

According to one embodiment, an average polarization value of the first or second area may correspond to half of a polarization value of each of the ferroelectric domains.

According to one embodiment, the dielectric thin film may have multiple dielectric constants by controlling the polarization for each unit cell.

In order to achieve the technical objects, the present disclosure provides a memcapacitor.

In accordance with an aspect of the present disclosure, the memcapacitor includes: a first electrode; a second electrode; and the dielectric thin film disposed between the first electrode and the second electrode, wherein the ferroelectric domains and the spacers in the dielectric thin film are alternately and laterally stacked between the first electrode and the second electrode.

According to an embodiment of the present invention, the dielectric thin film includes: a plurality of ferroelectric domains including phonons having displacement in a direction of a first axis; and a plurality of spacers configured to block elastic interaction between the phonons, wherein the ferroelectric domains and the spacers are alternately and repeatedly arranged along a second axis which is perpendicular to the first axis.

Due to the electric field applied from the outside, the phonons of the ferroelectric domains may have the displacement in one direction or a direction anti-parallel to the one direction along the first axis. In other words, the polarization of the ferroelectric domains can be controlled according to the electric field applied from the outside.

Meanwhile, the spacers may have the fixed polarization with respect to the electric field applied from the outside, and may have the domain wall provided between the ferroelectric domains having displacements in directions anti-parallel to each other. In other words, at least one of the spacers disposed between the ferroelectric domains having the displacements in opposite directions may include the domain wall. In addition, as described above, the spacer may block the elastic interaction between the phonons, so that movements of the phonons in the domain wall can be blocked.

Therefore, the interaction between the electric dipoles among the phonons of the ferroelectric domain can be suppressed. Accordingly, a polarization area including the ferroelectric domain polarized in an anti-parallel direction can be expanded by the hopping of the domain wall.

In other words, one polarized ferroelectric domain may stably maintain a polarization value, so that polarization of only one ferroelectric domain can be controlled from among a plurality of ferroelectric domains. Therefore, the dielectric thin film including the ferroelectric domain and the spacer may have multiple dielectric properties.

BRIEF DESCRIPTION OF THE DRAWINGS

FIG. 1 is a schematic view showing a dielectric thin film according to an embodiment of the present invention.

FIG. 2 is a view showing a solid atomic structure of the dielectric thin film according to the embodiment of the present invention.

FIGS. 3 and 4 are views showing phonon distribution and a phonon mode of a hafnium oxide having a cubic crystal structure, which are provided for describing a method of manufacturing a dielectric thin film according to an embodiment of the present invention.

FIG. 5 is a view showing a molecular structure of a unit cell of the dielectric thin film according to the embodiment of the present invention.

FIG. 6 is a view showing a space group of the dielectric thin film according to the embodiment of the present invention.

FIG. 7 is a view showing a molecular structure and formation of a domain wall after polarization of the dielectric thin film according to the embodiment of the present invention.

FIG. 8 is a schematic sectional view showing a memcapacitor including a dielectric thin film according to an embodiment of the present invention.

FIGS. 9 and 10 are views showing polarization curves due to the formation of the domain wall of the dielectric thin film according to the embodiment of the present invention.

FIGS. 11 and 12 are views showing polarization curves due to local polarization of the dielectric thin film according to the embodiment of the present invention.

FIGS. 13 and 14 are views showing domain wall energy of the dielectric thin film according to the embodiment of the present invention.

DETAILED DESCRIPTION OF THE EXEMPLARY EMBODIMENTS

Hereinafter, exemplary embodiments of the present invention will be described in detail with reference to the accompanying drawings. However, the technical idea of the present invention is not limited to the embodiments, but may be realized in different foams. The embodiments introduced herein are provided to sufficiently deliver the spirit of the present invention to those skilled in the art so that the disclosed contents may become thorough and complete.

When it is mentioned in the specification that one element is on another element, it means that a first element may be directly formed on a second element, or a third element may be interposed between the first element and the second element. Further, in the drawings, thicknesses of membranes and areas are exaggerated for efficient description of the technical contents.

In addition, in the various embodiments of the present invention, the terms such as first, second, and third are used to describe various elements, but the elements are not limited to the tams. The terms are used only to distinguish one element from another element. Accordingly, an element mentioned as a first element in one embodiment may be mentioned as a second element in another embodiment. The embodiments described and illustrated herein include their complementary embodiments. Further, the term "and/or" in the specification is used to include at least one of the elements enumerated before and after the term.

In the specification, the terms of a singular form may include plural forms unless the context clearly indicates otherwise. Further, the terms such as "including" and "having" are used to designate the presence of features, numbers, steps, elements, or combinations thereof described in the specification, and shall not be construed to preclude any possibility of presence or addition of one or more other features, numbers, steps, elements, or combinations thereof.

Further, in the following description of the present invention, a detailed description of known functions and configurations incorporated herein will be omitted when it may make the subject matter of the present invention unnecessarily unclear.

FIG. 1 is a schematic view showing a dielectric thin film according to an embodiment of the present invention, FIG. 2 is a view showing a solid atomic structure of the dielectric thin film according to the embodiment of the present invention, and FIGS. 3 and 4 are views showing phonon distribution and a phonon mode of a hafnium oxide having a cubic crystal structure, which are provided for describing a method of manufacturing a dielectric thin film according to an embodiment of the present invention.

Referring to FIGS. 1 to 4, in a dielectric thin film 100 according to the embodiment of the present invention, spacers 110 and ferroelectric domains 120 may be alternately and repeatedly stacked.

According to one embodiment, the ferroelectric domain 120 may include a phonon that may have displacement in a direction of a first axis z. In this case, the dielectric thin film 100 may have a structure in which the ferroelectric domains 120 and the spacers 110 are alternately and repeatedly arranged in a direction of a second axis y perpendicular to the direction of the first axis z.

As described above, the ferroelectric domain 120 may include a phonon which may be moved in the direction of the first axis z. Accordingly, due to an electric field applied from an outside, the phonon of the ferroelectric domain 120 may have displacement in one direction (+z) or a direction (−z) anti-parallel to the one direction along the direction of the first axis z.

Meanwhile, the spacer 110 may not substantially include the phonon. Accordingly, the spacer 110 may block elastic interaction between the phonons of the ferroelectric domain 120, and the spacer 110 may not be polarized by the electric field applied from the outside.

Therefore, the dielectric thin film 100 may have a periodic array of the ferroelectric domains 120 separated by the spacers 110.

According to one embodiment, as shown in FIG. 2, the dielectric thin film 100 may be a metal oxide having an orthorhombic crystal structure corresponding to a Pca2$_1$ space group. In this case, the phonon of the ferroelectric domain 120 may be included in an oxygen element of the metal oxide. In detail, as shown in FIG. 3, the dielectric thin film 100 may have a flat band connecting a F-point and a Y-point. In other words, the dielectric thin film 100 may have the same energy in a direction connecting the F-point and the Y-point.

In this case, the metal element of the dielectric thin film 100 at the Y-point may be displaced in an anti-parallel direction about a plane perpendicular to the first axis z. Accordingly, a steric space in which the oxygen element of the dielectric thin film 100 may slide may be provided. Therefore, as described above, the ferroelectric domain 120 including the phonon that is movable along the first axis z may be provided.

According to the embodiment of the present invention, the dielectric thin film 100 may be a hafnium oxide having an orthorhombic crystal structure. In general, the hafnium oxide may have the orthorhombic crystal structure at a room temperature, but may sequentially have a tetragonal crystal structure and a cubic crystal structure as the temperature increases. For example, the hafnium oxide may have a tetragonal crystal structure at a temperature of 2870 K, and may have a cubic crystal structure at a temperature exceeding 2870 K.

In detail, for example, when the dielectric thin film 100 is a hafnium oxide, the hafnium oxide may be manufactured by pulse laser deposition (PLD) on a substrate at a temperature of 800° C. or higher. Immediately after the pulse laser deposition, the hafnium oxide may be cooled to the room temperature, so that the hafnium oxide may mainly include an orthorhombic crystal phase. In this case, as an amount of the orthorhombic crystal phase included in the hafnium oxide increases, the hafnium oxide may have a structure in which the spacers 110 and the ferroelectric domains 120 are alternately and repeatedly stacked in the dielectric thin film 100.

As described above, when the dielectric thin film 100 is hafnium oxide, the substrate on which the hafnium oxide is deposited may have a lattice constant greater than a lattice constant of the hafnium oxide. For example, the hafnium oxide may be formed on a (111) plane of yttria-stabilized zirconia (YSZ) having a lattice constant of about 5.12 Å or strontium titanate (SrTiO$_3$) having a lattice constant of about 5.5 Å. Accordingly, a $\Gamma_{15}^z$ phonon mode and a $Y_5^z$ phonon mode may be enhanced at the Γ-point which will be described below, so that the spacer 110 and the ferroelectric domain 120 may be easily generated in the hafnium oxide.

When the hafnium oxide has the cubic crystal structure, the hafnium oxide may have phonon distribution as shown in FIG. 3. In this case, as shown in FIG. 4, the hafnium oxide having the cubic crystal structure may have a phonon mode including one of $X_2'$, $\Gamma_{15}^z$, $X_5^y$, $Y_5^z$, or $Z_5^x$.

In general, the hafnium oxide having the cubic crystal structure may mainly have the $X_2'$ phonon mode having the lowest energy. As shown in FIG. 4, the $X_2'$ phonon mode may include an oxygen element that may have displacement in parallel (+x) and anti-parallel (−x) directions with respect to a direction of a third axis x perpendicular to both the first axis z and the second axis y.

In addition, as shown in FIG. 3, the hafnium oxide having the cubic crystal structure may have a flat band in a frequency range of 200 to 300 cm$^{-1}$. In this case, the hafnium oxide having the cubic crystal structure may have the $\Gamma_{15}^z$ phonon mode (hereinafter referred to as "first phonon mode") at the Γ-point of the flat band, and may have the $Y_5^z$ phonon mode (hereinafter referred to as "second phonon mode") at an X-point of the flat band.

As shown in FIG. 4, the first phonon mode may include an oxygen element that is movable in a direction (+z) parallel to the first axis z about a plane (i.e., an xz plane) including the first axis z. In other words, when a unit cell 130 of the hafnium oxide having the cubic crystal structure about the xz plane includes a first half-unit cell and a second half-unit cell, in the first phonon mode, the oxygen element in the first half-unit cell and the oxygen element in the second half-unit cell may have displacement in the same direction (+z).

Meanwhile, the second phonon mode may include an oxygen element that is movable in parallel (+z) and anti-parallel (−z) directions with respect to the first axis z about the xz plane. In other words, in the second phonon mode, the oxygen element (−z) in the first half-unit cell and the oxygen element (+z) in the second half-unit cell may have displacement in directions anti-parallel to each other.

In this case, a displacement magnitude of the oxygen element in the second phonon mode may be substantially the same as a displacement magnitude of the oxygen element in the first phonon mode. In other words, the phonons included in the oxygen elements in the first phonon mode and the second phonon mode may be moved with the same amplitude.

Accordingly, when the hafnium oxide having the cubic crystal structure has energy corresponding to a flat band, the first phonon mode and the second phonon mode having the same amplitude may be linearly combined to have a third phonon mode. Therefore, in one of the first half-unit cell or the second half-unit cell, the third phonon mode may include a phonon having displacement in the same direction as the first or second phonon mode, and in the remaining one of the first half-unit cell or the second half-unit cell, the third phonon mode may include a phonon having substantially no displacement.

As described above, as the temperature decreases, a crystal lattice in the cubic crystal structure of the hafnium oxide may be condensed, and the hafnium oxide may sequentially have the tetragonal crystal structure and the orthorhombic crystal structure. As described above with reference to FIGS. 1 and 2, the hafnium oxide having the orthorhombic crystal structure may have a structure in which the spacers 110 and the ferroelectric domains 120 are alternately and continuously arranged.

Therefore, the hafnium oxide having the orthorhombic crystal structure may be formed by condensing a crystal lattice of the third phonon mode that is formed by linearly combining the first phonon mode and the second phonon mode.

Unlike the description given above, the crystal lattice of the $X_2'$ phonon mode mainly included in the hafnium oxide having the cubic crystal structure may be condensed to form the hafnium oxide having the orthorhombic crystal structure. However, all phonons of the $X_2'$ phonon mode may have displacement, so that it may not be easy to form the dielectric thin film 100 including the spacer 110 and the ferroelectric domain 120.

However, as described above, the hafnium oxide having the orthorhombic crystal structure may be formed by condensing the crystal lattice of the third phonon mode. Accordingly, the dielectric thin film 100 including the spacer 110 and the ferroelectric domain 120 may be formed. In detail, in the third phonon mode, one of the half-unit cells including the phonon having substantially no displacement may be condensed to form the spacer 110, and in the third phonon mode, the remaining one of the half-unit cells including the phonon having the displacement in the same direction as the first or second phonon mode may be condensed to form the ferroelectric domain 120.

Therefore, according to the embodiment of the present invention, each of the ferroelectric domain 120 and the spacer 110 formed as described above may have a width corresponding to half of the unit cell 130 of the hafnium oxide having the orthorhombic crystal structure. In detail, for example, each of the ferroelectric domain 120 and the spacer 110 may have a width of 3 Å or less in the second axis y.

According to one embodiment, as shown in FIG. 2, the ferroelectric domain 120 may include a first phase that may have displacement in one direction along the first axis z, or a second phase that may have displacement in a direction anti-parallel to the one direction.

In detail, as shown in FIG. 2(a), when a ferroelectric domain 120a includes the first phase, the phonon may have a steric space in an up-direction, and as shown in FIG. 2(b), when a ferroelectric domain 120b includes the second phase, the phonon may have a steric space in a down-direction. As described above, the phonon may be moved to the steric space. Accordingly, according to the electric field applied from the outside, the ferroelectric domain 120a having the first phase may have up-polarization, and the ferroelectric domain 120b having the second phase may have down-polarization.

FIG. 5 is a view showing formation of a domain wall and a molecular structure of a unit cell of the dielectric thin film according to the embodiment of the present invention, FIG. 6 is a view showing a space group of the dielectric thin film according to the embodiment of the present invention, and FIG. 7 is a view showing a molecular structure after polarization of the dielectric thin film according to the embodiment of the present invention.

Referring to FIG. 5, as described above with reference to FIGS. 1 to 4, the spacer 110 may not include a movable phonon. In detail, as shown in FIG. 5, in the unit cell 130 including one spacer 110 and one ferroelectric domain 120, the spacer 110 may include four oxygen elements denoted by O1, O4, O5, and O8, and the ferroelectric domain 120 may include four oxygen elements denoted by O2, O3, O6, and O7.

In this case, the oxygen elements included in the spacer 110 may have centrosymmetry along the first axis z. In other words, a first oxygen element O1 and an eighth oxygen element O8 may have centrosymmetry along the first axis z, and a fourth oxygen element O4 and a fifth oxygen element O5 may have centrosymmetry along the first axis z.

Therefore, the spacer 110 may be non-polar, so that as described above with reference to FIGS. 1 to 4, the spacer 110 may not be polarized according to the electric field applied from the outside.

According to one embodiment, the dielectric thin film 100 may include a plurality of spacers 110 and a plurality of ferroelectric domains 120. Accordingly, the dielectric thin film 100 may have an orthorhombic crystal structure corresponding to a Pbca space group.

As shown in FIG. 6(a), the dielectric thin film 100 may have an orthorhombic crystal structure corresponding to a $Pca2_1$ space group. However, when the dielectric thin film 100 in which the ferroelectric domain 120 having only one of the first phase or the second phase is separated about the spacer 110 is formed, as the number of times the ferroelectric domains 120 and the spacers 110 are alternately stacked increases, dipole-dipole interaction between the ferroelectric domains 120 may be increased.

Therefore, as shown in FIG. 6(b), the dielectric thin film 100 may be polarized, so that the dielectric thin film 100 may have a structure in which one ferroelectric domain 120a having the first phase and one ferroelectric domain 120b having the second phase are arranged with one spacer 110 interposed therebetween. In other words, the polarized dielectric thin film 100 may have a structure in which two ferroelectric domains 120 having polarization directions anti-parallel to each other are arranged with one spacer 110 interposed therebetween.

Therefore, the dipole-dipole interaction may not substantially occur in the polarized dielectric thin film 100. In detail, as shown in FIG. 6(b), the polarized dielectric thin film 100 may have the orthorhombic crystal structure corresponding to the Pbca space group. For example, the orthorhombic crystal structure corresponding to the Pbca space group (i.e., the polarized dielectric thin film 100) may have energy of 0.09 eV which is lower than energy of the orthorhombic crystal structure corresponding to the $Pca2_1$ space group (i.e., the dielectric thin film 100 that is not polarized).

According to one embodiment, the polarized dielectric thin film 100 may have a domain wall 140 in one spacer 110 disposed between two ferroelectric domains 120 having polarization directions anti-parallel to each other.

In detail, as shown in FIG. 6(*a*), the dielectric thin film 100 including the ferroelectric domains 120 having only the same polarization direction may be polarized as the polarization direction of at least one of the ferroelectric domains 120 is changed into an anti-parallel direction by the electric field applied from the outside.

In other words, as shown in FIG. 7, the polarized dielectric thin film 100 may include a first area in which only the ferroelectric domain 120*a* including the first phase is continuously arranged, and a second area in which only the ferroelectric domain 120*b* including the second phase is continuously arranged. In this case, the domain wall 140 may be formed in the spacer 110 between the first area and the second area.

The domain wall 140 manufactured as described above may not substantially change the structure of the spacer 110. In other words, when compared to the dielectric thin film 100 before the polarization, in the polarized dielectric thin film 100, only a position of the oxygen element including the phonon may be changed. In addition, volumes of the dielectric thin film 100 before and after the polarization may be substantially the same.

Unlike the description given above, generally, perovskite used mainly as a ferroelectric material may not include the spacer 110, and may have a structure in which unit cells 130 including metal elements which may have displacement are continuously arranged. Accordingly, due to the electric field applied from the outside, electric dipole (ferroelectric polarization) interaction may occur between the metal elements of unit cells 130 which are adjacent to each other while sharing one side. In other words, polar atomic displacement between the metal elements of the adjacent unit cells 130 may be shared.

In detail, due to the electric field applied from the outside, the perovskite may include a first region having the up-polarization, a second region having the down-polarization, and a wall area formed between the first region and the second region. In this case, the wall area may include an area having polarization gradually changing from the polarization of the first region to the polarization of the second region. In other words, the wall area may include a plurality of unit cells 130 of the perovskite, and the unit cells 130 included in the wall area may include metal elements having mutually different displacement. Accordingly, a structure of the perovskite may be changed by the electric field applied from the outside.

However, according to one embodiment, as described above, the dielectric thin film 100 may include the spacer 110, so that the polarized dielectric thin film 100 that is substantially strain-free may be foiled by the electric field applied from the outside.

According to one embodiment, as described above, the polarized dielectric thin film 100 may have substantially no volume change in comparison with the dielectric thin film 100 before the polarization. Accordingly, a width of the domain wall 140 along the second axis y may substantially converge to 0. Meanwhile, the first area and the second area may have polarizations in opposite directions about the domain wall 140. In general, energy of the domain wall 140 may be calculated by a differential value of polarization P as shown in Expression 1 below.

$$E \propto g \left| \frac{\partial P_z}{\partial y} \right|^2 = g \left| \vec{\nabla} \times \vec{P} \right|^2 \qquad \langle \text{Expression 1} \rangle$$

In this case, g denotes a group velocity of the phonons.

Therefore, the energy of the domain wall 140 may substantially converge to a value of infinity. In detail, for example, when the polarized dielectric thin film 100 is a hafnium oxide having an orthorhombic crystal structure, the energy of the domain wall 140 may be 1.34 eV or more.

Meanwhile, the polarized dielectric thin film 100 may have a flat band, so that the group velocity of the phonons in the domain wall 140 may substantially converge to 0.

Unlike the description given above, the dielectric thin film 100 may be the perovskite. In this case, as described above, the wall area of the perovskite may be disposed between the first region and the second region having the polarizations in the opposite directions, and may have polarization that is gradually changed from the polarization of the first region to the polarization of the second region. Therefore, the energy of the wall area may have a finite value. In detail, for example, when the perovskite is lead titanate ($PbTiO_3$), the energy of the wall area may be 0.024 eV.

In addition, as described above, the wall area may have electric dipole interaction between the metal elements having the phonons, so that the group velocity of the phonons in the wall area may have a finite value other than 0. Therefore, polarization of the perovskite due to the electric field applied from the outside may be performed by propagation of the domain wall 140. In other words, a polarized region may be formed in the perovskite by the electric field applied from the outside, wherein the polarized region may be expanded by the propagation of the wall area.

However, as described above, the polarized dielectric thin film 100 formed according to the embodiment of the present invention may include a zero-width domain wall 140 substantially having a width of 0, so that the energy of the domain wall 140 may be higher than the energy of the perovskite. Therefore, the polarization of the dielectric thin film 100 due to the electric field applied from the outside may be performed by hopping of the domain wall 140.

In other words, at least one of the ferroelectric domains 120 may be polarized by the electric field applied from the outside, and another ferroelectric domain 120 adjacent to the polarized ferroelectric domain 120 may be polarized by the hopping of the domain wall 140.

According to one embodiment, as described above with reference to FIGS. 1 to 4, the spacer 110 may not be polarized by the electric field applied from the outside. Meanwhile, the ferroelectric domain 120 may have a polarization value according to the electric field applied from the outside.

In addition, as described above, the dielectric thin film 100 may have a structure in which the spacers 110 having no polarization value and the ferroelectric domains 120 which may have polarization values are alternately and repeatedly arranged.

Therefore, a polarization value of the first area and a polarization value of the second area of the polarized dielectric thin film 100 may have pulse values. In other words, a first polarization value may be a first pulse value when the first area has the first polarization value, and a second polarization value may be a second pulse value when the second area has the second polarization value.

According to one embodiment, as described above, the first area and the second area may have polarization values in the form of a pulse. In this case, the first area may have the up-polarization, and the second area may have the down-polarization. Accordingly, the first polarization value may have a positive sign, and the second polarization value may have a negative sign.

Therefore, an average polarization value of the first area may be lower than the polarization values of the ferroelectric domains 120*a* included in the first area, and an average polarization value of the second area may be higher than polarization values of the ferroelectric domains 120b included in the second area. As described above, since the second area has a negative sign, an absolute value of the average polarization value of the first or second area may be substantially lower than an absolute polarization value of the ferroelectric domain 120 included in each of the areas.

According to one embodiment, as described above, the spacer 110 may not be polarized, so that the spacer 110 may have a polarization value of 0 regardless of the electric field applied from the outside. Therefore, the average polarization value of the first or second area may correspond to half of the polarization value of each of the ferroelectric domains 120 included in each of the areas regardless of the number of the unit cells 130 in the first or second area.

According to one embodiment, the polarization of the dielectric thin film 100 may be controlled for each unit cell 130, so that the dielectric thin film 100 may have multiple dielectric properties. In general, activation energy required for polarization of the ferroelectric material may be determined in proportion to an inherent coercive force of the ferroelectric material. However, when a polarized region is formed in the ferroelectric material by the activation energy, the polarized region may be expanded by propagation or hopping of the wall area. In this case, as in the perovskite, when a width of the wall area is thick, energy required for the expansion of the polarized region may be reduced in proportion to the width of the wall area.

Meanwhile, according to the embodiment of the present invention, the wall area may be the domain wall 140 having a width converging to 0, so that the energy required for the expansion of the polarized area may have a value substantially the same as the activation energy. In other words, energy required for changing a polarization direction of one ferroelectric domain 120 in the second area making contact with the first area may be substantially the same as energy required for changing a polarization direction of the one ferroelectric domain 120 in the second area that does not make direct contact with the first area. Therefore, the polarization of the dielectric thin film 100 may be controlled for each unit cell 130. Accordingly, the number or a width of the first area and the second area may be easily controlled, so that the dielectric thin film 100 may exhibit multiple dielectric properties.

FIG. 8 is a schematic sectional view showing a memcapacitor including a dielectric thin film according to an embodiment of the present invention.

Referring to FIG. 8, a memcapacitor including a first electrode 210, a second electrode 220, and the dielectric thin film, which is described above with reference to FIGS. 1 to 7 and disposed between the first electrode 210 and the second electrode 220, may be manufactured.

For example, the first electrode 210 and the second electrode 220 may include at least one of platinum (Pt), aluminum (Al), cadmium (Cd), cobalt (Co), copper (Cu), iron (Fe), germanium (Ge), indium (In), magnesium (Mg), manganese (Mn), molybdenum (Mo), niobium (Nb), nickel (Ni), lead (Pb), antimony (Sb), selenium (Se), silicon (Si), tin (Sn), tantalum (Ta), tellurium (Te), titanium (Ti), tungsten (W), zinc (Zn), or zirconium (Zr).

In this case, the ferroelectric domains 120 and the spacers 110 in the dielectric thin film 100 may be alternately and laterally stacked between the first electrode 210 and the second electrode 220. The phonons of the ferroelectric domain 120 may have displacement in the direction of the first axis z perpendicular to the direction of the second axis y in which the ferroelectric domains 120 and the spacers 110 are stacked. Therefore, the memcapacitor may have a structure in which the first electrode 210, the dielectric thin film 100, and the second electrode 220 are sequentially stacked in the direction of the first axis z.

As described above with reference to FIGS. 1 to 7, the dielectric thin film 100 may include a plurality of ferroelectric domains 120 that may have polarization values which are variable according to an external electric field, and a plurality of spacers 110 having predetermined polarization values regardless of the external electric field, wherein the ferroelectric domains 120 and the spacers 110 may be alternately and repeatedly stacked.

The spacer 110 may block a movement of the phonon that may exhibit a polarization value, and may substantially have a polarization value of 0. Accordingly, when the external electric field corresponding to the activation energy or more is applied to the dielectric thin film 100, the domain wall 140 having high energy may be formed in the spacer 110.

As described above, the domain wall 140 may have the high energy to block the movement of the phonon, so that the displacement of the phonon may be transmitted by the hopping of the domain wall 140. In this case, energy required for the hopping of the domain wall 140 may be substantially similar to the activation energy. Therefore, a polarization value of one polarized ferroelectric domain 120 may be stably maintained, so that the polarization value of each of the ferroelectric domains 120 may be controlled.

Therefore, the memcapacitor includes the dielectric thin film 100 having a plurality of dielectric constants, so that a data processing capacity can be increased.

Hereinafter, property evaluation results for a dielectric thin film according to a specific experimental example of the present invention will be described.

FIGS. 9 and 10 are views showing polarization curves due to the formation of the domain wall of the dielectric thin film according to the embodiment of the present invention.

Referring to FIGS. 9 and 10, it was observed that dielectric thin films according to an experimental example and a comparative example of the present invention are polarized and exhibit mutually different polarization curves.

As described above with reference to FIGS. 1 to 7, a hafnium oxide, which is the dielectric thin film according to the experimental example of the present invention, may include a ferroelectric domain 120 having displacement, and a spacer substantially having a polarization value of 0 regardless of ab electric field applied from an outside. Accordingly, as shown in FIG. 9, it was observed that the hafnium oxide includes a first area exhibiting polarization in one direction, a second area exhibiting polarization in a direction anti-parallel to the first area, and a domain wall formed between the first area and the second region and substantially having a width of 0.

In this case, as described above, it may be understood that the polarization value is discontinuous with respect to the domain wall, and the polarization has opposite directions. Accordingly, it may be understood that a differential value $(\vec{\nabla} \times \vec{P})$ of the polarization converges to the value of infinity, and the group velocity of the phonons exhibiting the displacement in the domain wall converges to 0.

Meanwhile, as described above with reference to FIGS. 1 to 7, lead titanate ($PbTiO_3$), which is the dielectric thin film according to the comparative example of the present invention, may not include the spacer. Accordingly, as shown in FIG. 10, it may be understood that the lead titanate ($PbTiO_3$) includes a first region exhibiting polarization in one direction, a second region having a polarization direction opposite to the first region, and a wall area formed between the first region and the second region and having a polarization direction gradually changing from the polarization of the first region to polarization of the second region.

In addition, as described above, since the polarization value continuously changes in the domain wall, it may be understood that the differential value of the polarization is a predetermined value, and the group velocity of the phonons in the domain wall also has a predetermined value.

FIGS. 11 and 12 are views showing polarization curves due to local polarization of the dielectric thin film according to the embodiment of the present invention, and FIGS. 13 and 14 are views showing domain wall energy of the dielectric thin film according to the embodiment of the present invention.

Referring to FIGS. 11 to 14, for the dielectric thin films according to the experimental example and the comparative example of the present invention described above with reference to FIGS. 9 and 10, a polarization curve when one unit cell is polarized and energy required for expansion of a polarized area including the one unit cell 130 were observed.

Referring to FIG. 11, as described above with reference to FIG. 9, it may be understood that the hafnium oxide, which is the dielectric thin film according to the experimental example of the present invention, has a polarization value in an anti-parallel direction only in one ferroelectric domain that has polarization in one unit cell.

In detail, as shown in FIG. 13, it may be understood that energy required for polarizing the one unit cell is 1.34 eV. As described above with reference to FIGS. 1 to 7, it may be understood that as the domain wall is formed, the hafnium oxide has an orthorhombic crystal structure having the Pbca space group which is more stable in terms of energy and changed from the Pca2$_1$ space group. Accordingly, it may be understood that energy required for expansion of the second area including the one polarized unit cell is increased to 1.38 eV.

In addition, as described above, in the hafnium oxide, energy required for the polarization and energy required for the expansion of the polarized area may be high, and the movement of the phonon in the domain wall may be blocked. Accordingly, it may be understood that the polarized area is expanded by the hopping of the domain wall.

Meanwhile, as described above with reference to FIG. 10, it may be understood that the lead titanate, which is the dielectric thin film according to the comparative example of the present invention, has a domain area in which the polarization is gradually changed. Accordingly, as shown in FIG. 12, it may be understood that in the one polarized unit cell, the polarization direction of the one unit cell is an opposite direction, while the polarization value of the one unit cell is not an anti-parallel value.

In detail, as shown in FIG. 14, it was observed that the energy required for the polarization of the one unit cell is 0.76 eV. Accordingly, it may be understood that the lead titanate without the spacer has low activation energy (i.e., the energy required for the polarization of the one unit cell) in comparison with the hafnium oxide including the spacer.

In addition, as described above with reference to FIGS. 1 to 7, the lead titanate includes the wall area having a width greater than 0. Accordingly, it may be understood that the energy required for the expansion of the polarized area is decreased according to the width of the wall area so as to have a value of 0.024 eV as shown in FIG. 14. Therefore, it may be understood that an expansion speed of the polarized area in the dielectric thin film according to the comparative example of the present invention is faster than an expansion speed of the polarized area in the dielectric thin film according to the experimental example of the present invention.

Therefore, it may be understood that in the hafnium oxide, which is the dielectric thin film according to the experimental example of the present invention, only the polarization direction of one ferroelectric domain may be changed, and high energy is consumed for the propagation of the polarized area including one polarized ferroelectric domain. In other words, the polarization direction of the one polarized ferroelectric domain may be stably maintained. Accordingly, in the hafnium oxide, a polarization direction of each of the ferroelectric domains may be controlled, so that the hafnium oxide may exhibit multiple dielectric properties.

Although the exemplary embodiments of the present invention have been described in detail as described above, the scope of the present invention is not limited to a specific embodiment, and should be interpreted by the appended claims. Further, it should be understood by those skilled in the art to which the invention pertains that various changes and modifications can be made without departing from the scope of the present invention.

What is claimed is:

1. A device comprising:
    a lower electrode;
    a dielectric thin film disposed on the lower electrode; and
    an upper electrode disposed on the dielectric thin film,
    wherein the dielectric thin film comprises:
        a plurality of ferroelectric domains including phonons having displacement in a direction of a first axis extending in a direction in which the lower and upper electrodes are stacked; and
        a plurality of spacers configured to block elastic interaction between the phonons,
    wherein the ferroelectric domains and the spacers are alternately and repeatedly arranged along a second axis which is perpendicular to the first axis, and
    wherein the second axis is parallel to at least one of (a) an upper surface of the lower electrode, or (b) a lower surface of the upper electrode.

2. The device of claim 1, wherein
    the spacers include a domain wall having fixed polarization with respect to an externally-applied electric field, and
    the displacement of the phonons of the ferroelectric domains is changed by hopping of the domain wall.

3. The device of claim 1, wherein
    the dielectric thin film includes a hafnium oxide (HfO$_2$) having an orthorhombic crystal structure, and
    the phonons of the ferroelectric domains are included in an oxygen element of the hafnium oxide.

4. The device of claim 1, wherein the dielectric thin film has an orthorhombic crystal structure corresponding to a Pbca space group.

5. The device of claim 1, wherein
    the dielectric thin film includes a metal oxide having an orthorhombic crystal structure corresponding to a Pbca space group,
    the ferroelectric domains have a width corresponding to half of a unit cell of the metal oxide in the second axis, and
    the spacers have a width equal to the width of the ferroelectric domains.

6. The device of claim 1, wherein
    the dielectric thin film includes a hafnium oxide (HfO$_2$) having an orthorhombic crystal structure, and
    the ferroelectric domains have a width of 3 Å or less in the second axis.

7. The device of claim 1, wherein the dielectric thin film is a multiple dielectric constant thin film in which the phonons in each of the ferroelectric domains have displacement in one direction or a direction anti-parallel to the one direction along the first axis.

8. A dielectric thin film comprising spacers and ferroelectric domains, wherein
the spacers, which have fixed polarization with respect to an externally-applied electric field, and the ferroelectric domains, which have polarization controlled by the externally-applied electric field, are alternately and repeatedly provided,
one spacer and one ferroelectric domain constitute a unit cell,
the dielectric thin film further comprises a first area having a first polarization value and including a first plurality of unit cells,
the dielectric thin film further comprises a second area having a second polarization value and including a second plurality of unit cells,
the spacers of the first plurality of unit cells have a polarization lower than a polarization of the ferroelectric domains so that the first polarization value has a first pulse value, and
the spacers of the second plurality of unit cells have a polarization higher than the polarization of the ferroelectric domains so that the second polarization value has a second pulse value.

9. The dielectric thin film of claim 8, wherein the dielectric thin film includes a hafnium oxide ($HfO_2$).

10. The dielectric thin film of claim 8, wherein
an average polarization value of the first area is lower than polarization values of the ferroelectric domains included in the first area, and
an average polarization value of the second area is higher than polarization values of the ferroelectric domains included in the second area.

11. The dielectric thin film of claim 8, wherein an average polarization value of the first or second area corresponds to half of a polarization value of each of the ferroelectric domains.

12. The dielectric thin film of claim 8, wherein the dielectric thin film has multiple dielectric constants by controlling polarization for each unit cell.

13. A memcapacitor comprising:
a first electrode;
a second electrode; and
the dielectric thin film according to claim 8, which is disposed between the first electrode and the second electrode,
wherein the ferroelectric domains and the spacers in the dielectric thin film are alternately and laterally stacked between the first electrode and the second electrode.

14. A dielectric thin film comprising:
a plurality of ferroelectric domains including phonons having displacement in a direction of a first axis; and
a plurality of spacers configured to block elastic interaction between the phonons,
wherein the ferroelectric domains and the spacers are alternately and repeatedly arranged along a second axis which is perpendicular to the first axis, and
wherein the dielectric thin film has an orthorhombic crystal structure corresponding to a Pbca space group.

15. The dielectric thin film of claim 14, wherein:
the spacers include a domain wall having fixed polarization with respect to an externally-applied electric field, and
the displacement of the phonons is changed by hopping of the domain wall.

16. The dielectric thin film of claim 14, wherein:
the dielectric thin film includes a hafnium oxide ($HfO_2$) having the orthorhombic crystal structure, and
the phonons are included in an oxygen element of the hafnium oxide.

17. The dielectric thin film of claim 14, wherein:
the dielectric thin film includes a metal oxide having the orthorhombic crystal structure,
the ferroelectric domains have a width corresponding to half of a unit cell of the metal oxide in the second axis, and
the spacers have a width equal to the width of the ferroelectric domains.

18. The dielectric thin film of claim 14, wherein:
the dielectric thin film includes a hafnium oxide ($HfO_2$) having the orthorhombic crystal structure, and
the ferroelectric domains have a width of 3 Å or less in the second axis.

19. The dielectric thin film of claim 14, wherein:
one spacer and one ferroelectric domain constitute a unit cell, and
the dielectric thin film has multiple dielectric constants by controlling the polarization for each unit cell.

20. A memcapacitor comprising:
a dielectric thin film according to claim 14;
an upper electrode disposed on the dielectric thin film in the first axis; and
a lower electrode disposed under the dielectric thin film in the first axis,
wherein the dielectric thin film includes a multiple dielectric constant thin film in which the phonons in each of the ferroelectric domains have displacement in one direction or a direction anti-parallel to the one direction along the first axis.

* * * * *